United States Patent
Ogihara et al.

(10) Patent No.: US 11,518,774 B2
(45) Date of Patent: Dec. 6, 2022

(54) METHOD FOR PRODUCING IODINE-CONTAINING SILICON COMPOUND

(71) Applicant: SHIN-ETSU CHEMICAL CO., LTD., Tokyo (JP)

(72) Inventors: Tsutomu Ogihara, Joetsu (JP); Tsukasa Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 428 days.

(21) Appl. No.: 16/597,929

(22) Filed: Oct. 10, 2019

(65) Prior Publication Data

US 2020/0148709 A1    May 14, 2020

(30) Foreign Application Priority Data

Nov. 12, 2018    (JP) .............................. JP2018-212146

(51) Int. Cl.
*C07F 7/18*    (2006.01)
*G03F 7/11*    (2006.01)

(52) U.S. Cl.
CPC .............. *C07F 7/1892* (2013.01); *G03F 7/11* (2013.01)

(58) Field of Classification Search
CPC ........................................................ G03F 7/11
See application file for complete search history.

(56) References Cited

U.S. PATENT DOCUMENTS

| | | | | |
|---|---|---|---|---|
| 4,048,206 | A | * 9/1977 | Voronkov | A01N 55/00 556/405 |
| 6,780,471 | B2 | * 8/2004 | Chevalier | C07F 7/0836 427/387 |
| 2003/0130389 | A1 | 7/2003 | Chevalier et al. | |
| 2008/0227941 | A1 | 9/2008 | Mizoshita et al. | |
| 2013/0079530 | A1 | 3/2013 | Takahashi et al. | |
| 2015/0011509 | A1 | 1/2015 | Hergenrother et al. | |
| 2016/0301018 | A1 | 10/2016 | Youfu et al. | |
| 2019/0258160 | A1 | * 8/2019 | Satoh | G03F 7/0042 |
| 2020/0159120 | A1 | * 5/2020 | Ogihara | G03F 7/0751 |

FOREIGN PATENT DOCUMENTS

| | | | | |
|---|---|---|---|---|
| CN | 102051121 | A | * 5/2011 | |
| JP | 2003-531942 | A | 10/2003 | |
| JP | 2005001996 | A | * 1/2005 | |
| JP | 2008-214314 | A | 9/2008 | |
| JP | 2015-122437 | A | 7/2015 | |
| JP | 2018029264 | | * 2/2018 | |
| WO | 2001/083608 | A1 | 11/2001 | |
| WO | WO-2006097717 | A1 | * 9/2006 | .......... C07F 15/0033 |
| WO | 2011/108712 | A1 | 9/2011 | |
| WO | 2013/056073 | A1 | 4/2013 | |
| WO | WO-2013056073 | A1 | * 4/2013 | .............. C07H 15/26 |

OTHER PUBLICATIONS

Y. Maegawa et al., 69 Tetrahedron, 5312-5318 (2013) (Year: 2013).*
Y. Maegawa et al., 63 Tetrahedron, 11467-11474 (2013) (Year: 2013).*
M. Kauch et al., 10 Synthesis, 1578-1589 (2006) (Year: 2006).*
G. Cerveau et al., 626 Journal of Organometallic Chemistry, 92-99 (2001) (Year: 2001).*
R. Beckwith, 554 Nature, 36-38 (2018) (Year: 2018).*
H. Kinoshita et al., 15 Organic Letters, 2962-2965 (2013) (Year: 2013).*
Mar. 12, 2020 Extended European Search Report issued in European Patent Application No. 19208618.9.
Maegawa Yoshifumi et al: "A new synthetic approach for functional triisopropoxyorganosilanes using molecular building blocks", Tetrahedron, Elsevier Science Publishrs, Amsterdam, NL, vol. 69, No. 26, pp. 5312-5318, XP028551479.
Maegawa Yoshifumi et al: "Preparation of functionalized aryl(diallyl)ethoxysilanes and their palladium-catalyzed coupling reactions giving sol-gel precursors", Tetrahedron, Elsevier Science Publishrs, Amsterdam, NL, vol. 63, No. 46, pp. 11467-11474, XP022284182.
Jan. 18, 2022 Office Action issued in Japanese Patent Application No. 2018-212146.
Jesus Hierrezuelo et al: "Synthesis and Structural Analysis of Substituted Tripod-Shaped Tri- and Tetra(p-phenylene)s", Eur. J. Org. Chem., 2010, pp. 5672-5680.

(Continued)

*Primary Examiner* — Alexander R Pagano
(74) *Attorney, Agent, or Firm* — Oliff PLC

(57) ABSTRACT

A method for producing a silicon compound containing an iodophenyl group, including substituting iodine for a trialkylsilyl ($(R^0)_3Si$) group bonded to a phenyl group by using an iodine-containing electrophilic reagent (I-X) as shown by the following reaction equation:

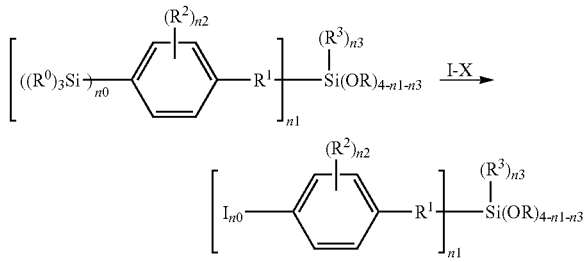

where all of $R^0$'s may be identical to or different from each other and each represent an alkyl group having 1 to 6 carbon atoms; $R^1$ represents a single bond or a divalent organic group; $R^2$ represents an organic group having 1 to 10 carbon atoms; $R^3$ represents an organic group having 1 to 10 carbon atoms; R represents an organic group having 1 to 6 carbon atoms; n0 is 1, 2, or 3, n1 is 1, 2, or 3, n2 is 0, 1, or 2, and n3 is 0, 1, or 2, provided that $1 \leq n1+n3 \leq 3$; and X represents a counter substituent of iodine, acting as an electrophilic reactive species.

4 Claims, No Drawings

(56) References Cited

OTHER PUBLICATIONS

Jul. 13, 2021 Notification of Reasons for Refusal issued in Japanese Patent Application No. 2018-212146.
Jul. 23, 2021 Office Action issued in Korean Patent Application No. 10-2019-0143460.

* cited by examiner

METHOD FOR PRODUCING IODINE-CONTAINING SILICON COMPOUND

TECHNICAL FIELD

The present invention relates to a method for producing an iodine-containing silicon compound.

BACKGROUND ART

Iodine-containing compounds highly efficient in absorbing EUV light are expected to improve the performance of resist for EUV, which is currently one of problems in the industrialization of EUV lithography. As a stable iodine-containing compound, an organic group having iodine directly bonded to an aromatic ring, particularly an iodophenyl group, is introduced into a silicon-containing resist underlayer film (hereinafter referred to as polysiloxane underlayer film). Such an underlayer film is expected to have a possibility of improving the performance of patterning an EUV resist.

To obtain such a polysiloxane underlayer film having an iodophenyl group, a hydrolysable silicon compound having an iodophenyl group introduced therein is necessary (hereinafter referred to also as iodine-containing silicon compound). As methods for producing such an iodine-containing silicon compound, there have been known: a method in which a Grignard reagent is prepared from a bromophenyl-silane compound and Mg and reacts with iodine (Patent Document 1: paragraph [0058]); a method in which iodophenylene and a certain Grignard reagent are allowed to react on each other and then react with a tetraalkoxysilane (Patent Document 2: paragraph [0085]); and so forth.

However, in the method of Patent Document 1, to prevent the self-reaction with the Grignard reagent, the hydrolysable alkoxy groups of the iodine-containing silicon compound have to be a particular group having low reactivity. This limits the hydrolytic properties of the iodine-containing silicon compound to be obtained, and consequently only a compound which is narrowly applicable is produced in some cases. Moreover, to prevent the self-reaction in the method of Patent Document 2 also, the production reaction progresses under moderate conditions for a period as long as 44 hours, which is uneconomical.

Further, as another organic chemistry method, an iodophenyl group is possibly synthesized via a benzene diazonium salt as shown in the following reaction equation. Nevertheless, this is not suitable for the production of a hydrolysable silicon-containing compound because an aqueous reagent needs to be used during the course of the reaction.

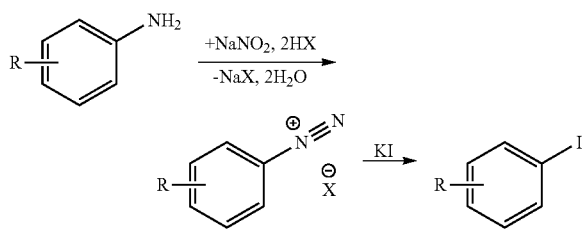

CITATION LIST

Patent Literature

Patent Document 1: WO 01/83608
Patent Document 2: Japanese Unexamined Patent Application Publication No. 2008-214314

SUMMARY OF INVENTION

Technical Problem

As described above, there have been demands for a more economical production method for an iodine-containing silicon compound such that the substitution position can be selected freely without hydrolyzing a hydrolysable alkoxy group, and without restriction to the type of the alkoxy group.

The present invention has been made to solve the above-described problems. An object of the present invention is to provide a method for economically producing an iodophenyl group-containing silicon compound without causing hydrolysis of a hydrolysable alkoxy group.

Solution to Problem

To achieve the object, the present invention provides a method for producing a silicon compound containing an iodophenyl group, comprising substituting iodine for a trialkylsilyl (($R^0$)$_3$Si) group bonded to a phenyl group by using an iodine-containing electrophilic reagent (I-X) as shown by the following reaction equation:

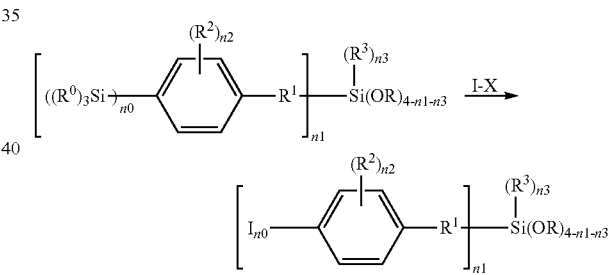

wherein all of $R^0$'s may be identical to or different from each other and each represent an alkyl group having 1 to 6 carbon atoms; $R^1$ represents a single bond or a divalent organic group; $R^2$ represents an organic group having 1 to 10 carbon atoms; $R^3$ represents an organic group having 1 to 10 carbon atoms; R represents an organic group having 1 to 6 carbon atoms; n0 is 1, 2, or 3, n1 is 1, 2, or 3, n2 is 0, 1, or 2, and n3 is 0, 1, or 2, provided that 1≤n1+n3≤3; and X represents a counter substituent of iodine, acting as an electrophilic reactive species.

The inventive production method makes it possible to economically produce an iodophenyl group-containing silicon compound without causing hydrolysis of the hydrolysable alkoxy group.

In the inventive production method, the $R^0$ is preferably a methyl group or an ethyl group.

In such a production method, the trialkylsilyl (($R^0$)$_3$Si) group readily leaves, so that the reaction progresses under moderate conditions, and an iodophenyl group-containing silicon compound can be produced more economically without causing hydrolysis of the hydrolysable alkoxy group.

Moreover, in the inventive production method, the iodine-containing electrophilic reagent is preferably iodine monochloride.

The use of such an iodine-containing electrophilic reagent causes less side reaction and also makes the by-product easily separate. This enables further economical production of an iodophenyl group-containing silicon compound.

Advantageous Effects of Invention

As described above, the inventive method for producing a silicon compound containing an iodophenyl group makes it possible to economically produce an iodophenyl group-containing silicon compound, which is industrially useful, particularly useful in forming an underlayer film for EUV lithography. Accordingly, the industrial value of the inventive method is quite high.

DESCRIPTION OF EMBODIMENTS

As described above, there have been demands for the development of a method for more economically producing an iodine-containing silicon compound such that the substitution position can be selected freely without hydrolyzing a hydrolysable alkoxy group and without limitation to the type of the alkoxy group.

Generally, as a method for forming the skeleton of an organic compound or a silicon compound, there is known a method in which an organometallic reagent represented by a Grignard reagent is used. However, since iodine-carbon bond is highly reactive, when an organometallic reagent is prepared with iodine being held, dedicated reaction conditions are required as described in Patent Documents 1 and 2. The reaction requiring such dedicated conditions is not applicable to wide usage, and it is very difficult to produce a target silicon compound in a cost-effective industrial scale.

The present inventors have earnestly studied to solve the above problems and consequently developed a method in which, first, a trialkylsilyl group is introduced to a desired position on a phenyl group, the skeleton of a silicon compound is formed by various organic reactions, and finally the trialkylsilyl group is replaced with iodine. Thereby, the present invention has been completed.

Specifically, the present invention is a method for producing a silicon compound containing an iodophenyl group, comprising substituting iodine for a trialkylsilyl ($(R^0)_3Si$) group bonded to a phenyl group by using an iodine-containing electrophilic reagent (I-X) as shown by the following reaction equation:

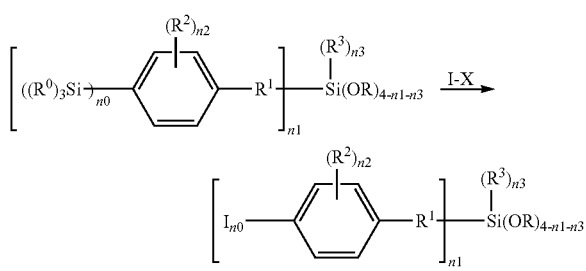

wherein all of $R^0$'s may be identical to or different from each other and each represent an alkyl group having 1 to 6 carbon atoms; $R^1$ represents a single bond or a divalent organic group; $R^2$ represents an organic group having 1 to 10 carbon atoms; $R^3$ represents an organic group having 1 to 10 carbon atoms; R represents an organic group having 1 to 6 carbon atoms; n0 is 1, 2, or 3, n1 is 1, 2, or 3, n2 is 0, 1, or 2, and n3 is 0, 1, or 2, provided that $1 \leq n1+n3 \leq 3$; and X represents a counter substituent of iodine, acting as an electrophilic reactive species.

Hereinafter, embodiments of the present invention will be described in detail. However, the present invention is not limited thereto.

In the present invention, an electrophilic reagent containing iodine is caused to act on a trialkylsilyl ($(R^0)_3Si$) group having been introduced as a leaving group on a phenyl group, and the ipso position of the trialkylsilyl group, that is, a trialkylsilyl group itself, is substituted with iodine. Thus, iodine can be introduced efficiently in terms of positional selectivity under moderate conditions at approximately room temperature in a short time.

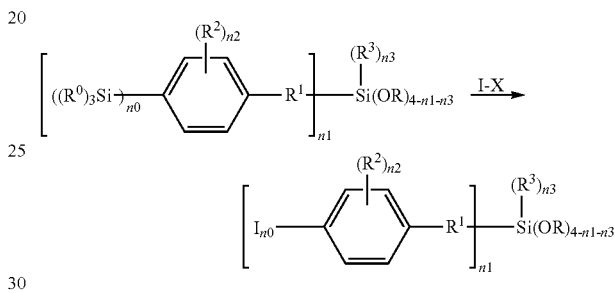

In the reaction equation, all of $R^0$'s may be identical to or different from each other and each represent an alkyl group having 1 to 6 carbon atoms, $R^1$ represents a single bond or a divalent organic group, $R^2$ represents an organic group having 1 to 10 carbon atoms, $R^3$ represents an organic group having 1 to 10 carbon atoms, and R represents an organic group having 1 to 6 carbon atoms. n0 is 1, 2, or 3, n1 is 1, 2, or 3, n2 is 0, 1, or 2, and n3 is 0, 1, or 2, provided that $1 \leq n1+n3 \leq 3$. X is a counter substituent of iodine and acts as an electrophilic reactive species.

A raw material used in the inventive production method, specifically a silicon compound having a trialkylsilyl ($(R^0)_3Si$) group bonded to a phenyl group, is a compound shown by the following general formula (1) (hereinafter also referred to as "trialkylsilylphenyl group-containing silicon compound").

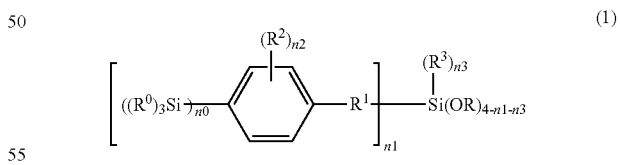

(1)

All of $R^0$'s may be the same as or different from each other and each represent an alkyl group having 1 to 6 carbon atoms, preferably an alkyl group having 1 to 3 carbon atoms, more preferably a methyl group or an ethyl group because the leaving ability of the $(R^0)_3Si$ group is higher.

$R^1$ is a single bond or a divalent organic group. The divalent organic group is not particularly limited. Examples thereof include a linear, branched, or cyclic alkylene group, a carbonyl group, an ester group (carbonyloxy group), an ether group, etc., and combinations thereof. Examples of the alkylene group include a methylene group, an ethylene group, and a propylene group. Examples of the combinations include combinations of a carbonyloxy group and an alkylene group (such as a carbonyloxymethylene group, a carbonyloxypropylene group).

$R^2$ is an organic group having 1 to 10 carbon atoms. Examples thereof include a linear, branched, or cyclic alkyl group, an alkoxy group, and an ester group. The alkyl group may further have an ester group, an ether group, or the like. Examples of the $R^2$ include a methyl group, an ethyl group, and a propyl group.

$R^3$ is an organic group having 1 to 10 carbon atoms. Examples thereof include those exemplified above as $R^2$.

R is an organic group having 1 to 6 carbon atoms. Examples thereof include a linear, branched, or cyclic alkyl group such as a methyl group, an ethyl group, a propyl group, and a butyl group.

n0 is 1, 2, or 3. n1 is 1, 2, or 3. n2 is 0, 1, or 2. n3 is 0, 1, or 2. Since $1 \leq n1+n3 \leq 3$, the aforementioned raw material has 1 to 3 (OR) groups and is hydrolysable.

In the present invention, the trialkylsilyl $((R^0)_3Si)$ group bonded to the phenyl group in the trialkylsilylphenyl group-containing silicon compound is substituted with iodine by the iodine-containing electrophilic reagent (I-X). Hence, it is possible to select, as the raw material, the trialkylsilylphenyl group-containing silicon compound having the trialkylsilyl group (leaving group) located at a position to be substituted with iodine in a target iodophenyl group-containing silicon compound.

Next, examples of the iodine-containing electrophilic reagent (I-X, where I represents iodine, and X represents a counter substituent of iodine, acting as an electrophilic reactive species) used in the present invention include iodine, iodine halides (such as iodine monochloride, iodine monobromide), pyridine adducts thereof (such as PyICl), N-iodoimides, metal iodides, and the like. Particularly, iodine and iodine monochloride are preferable. Meanwhile, to increase the reaction rate, the materials may be irradiated with light or mixed with a Lewis acid such as aluminum chloride, zinc chloride, titanium tetrachloride, or boron trifluoride. The electrophilic reagent may be added in an amount of approximately 1 mol or more, at most 2 mol, relative to 1 mol of the trialkylsilyl group to be replaced with iodine. It is more preferable to adjust the amount of the electrophilic reagent to be added while tracing the reaction, as will be described below, so as not to induce side reaction. The iodine-containing electrophilic reagent can be added after dissolved in the following solvent.

Examples of the solvent used in the reaction include acetic acid, methylene chloride, chloroform, tetrachloromethane, chlorobenzene, and the like. Particularly, a halogenated hydrocarbon is preferable. The reaction temperature is preferably 0° C. or more but not more than the boiling point of the solvent, particularly preferably 10° C. or more and 40° C. or less from the economical viewpoint. The reaction may be performed under the reflux condition of the solvent.

The atmosphere under which the reaction is performed is not particularly limited, but can be an inert gas atmosphere such as nitrogen. By preventing water from entering the reaction system under such an atmosphere, it is possible to avoid the hydrolysis of the raw material and the final product during the reaction.

In view of yield, it is desirable to complete the reaction while tracing conversion by gas chromatography (GC) or the like. Nevertheless, the reaction time may be approximately 0.1 to 5 hours after the electrophilic reagent is added dropwise completely.

Depending on the iodine-containing electrophilic reagent (I-X), a trialkylhalosilane may be obtained as a by-product (when the counter substituent X of iodine is a halogen). In this case, after the reaction is completed, the target product can be isolated by distilling off the trialkylhalosilane obtained as the by-product together with the reaction solvent under reduced pressure. Further, as an alternative method, when the reaction raw material disappears, an alcohol-amine mixture may be added as a reaction terminator. This makes it possible to suppress a side reaction which progresses during the post-treatment of the reaction. When the alcohol-amine mixture is added, the trialkylhalosilane reacts therewith, forming trialkylalkoxysilane and an amine salt of hydrogen halide. After the formed amine salt is separated by filtration, an iodine-containing silicon compound can be obtained by distilling off the alcohol, the amine, and the reaction solvent. Iodine monochloride is preferably used as the iodine-containing electrophilic reagent because trialkylchlorosilane formed as a by-product can be easily separated from the product as described above.

The iodophenyl group-containing silicon compound that can be produced according to the inventive method as described above is not particularly limited. Examples thereof include the following compounds.

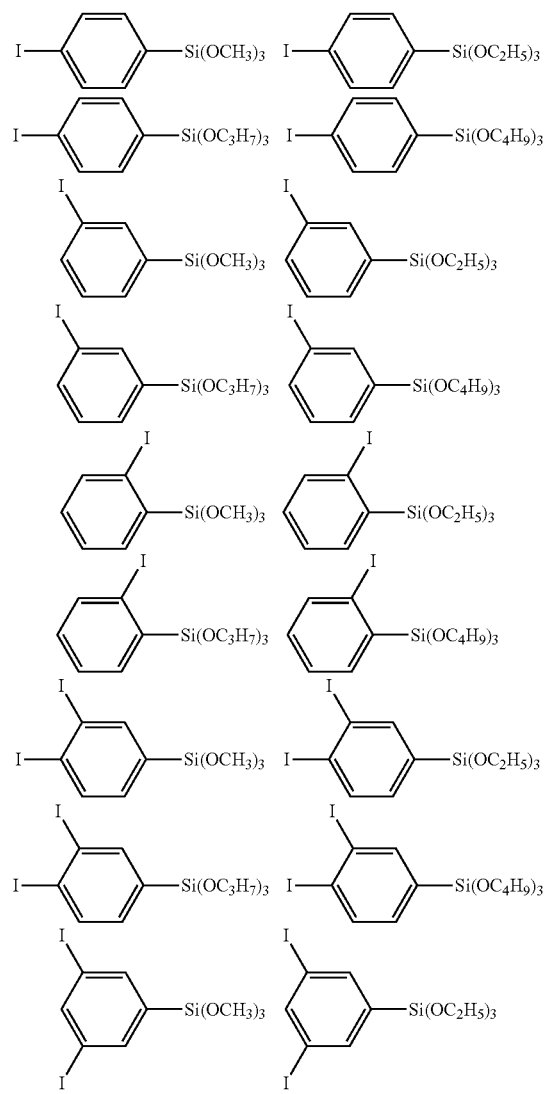

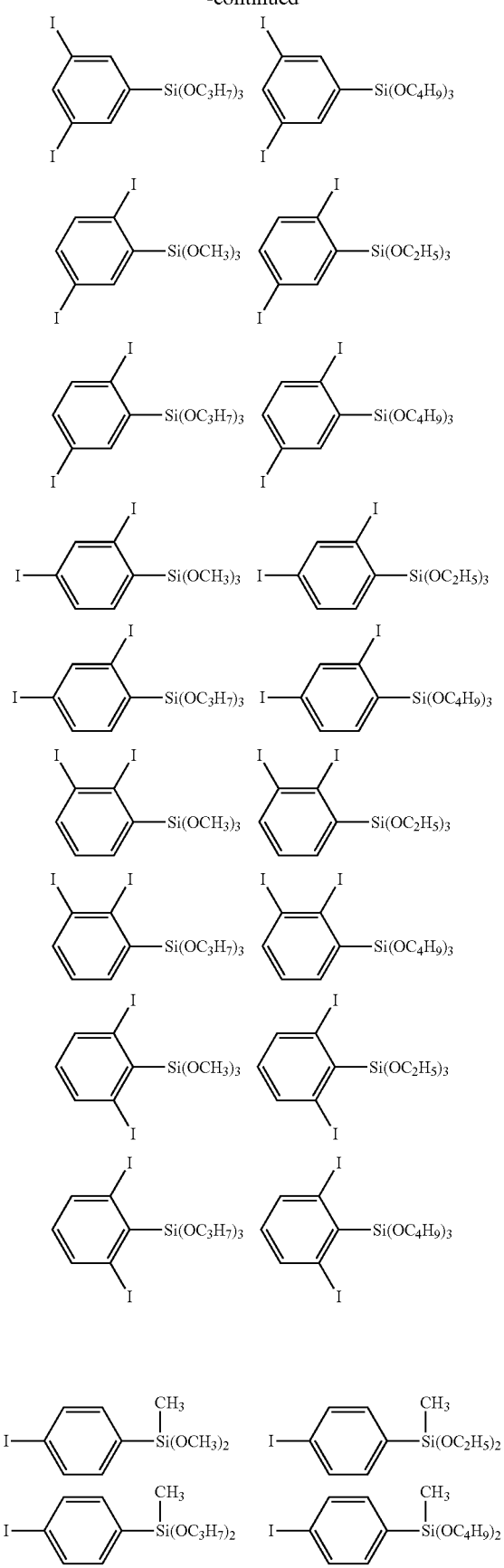
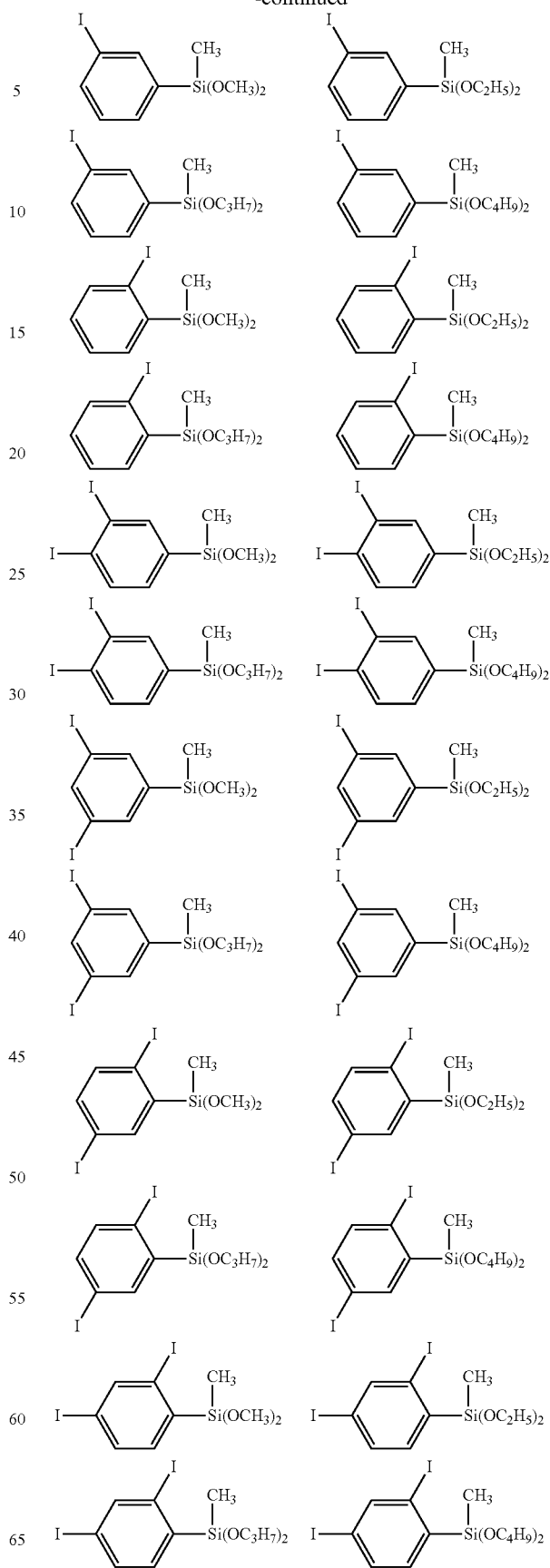

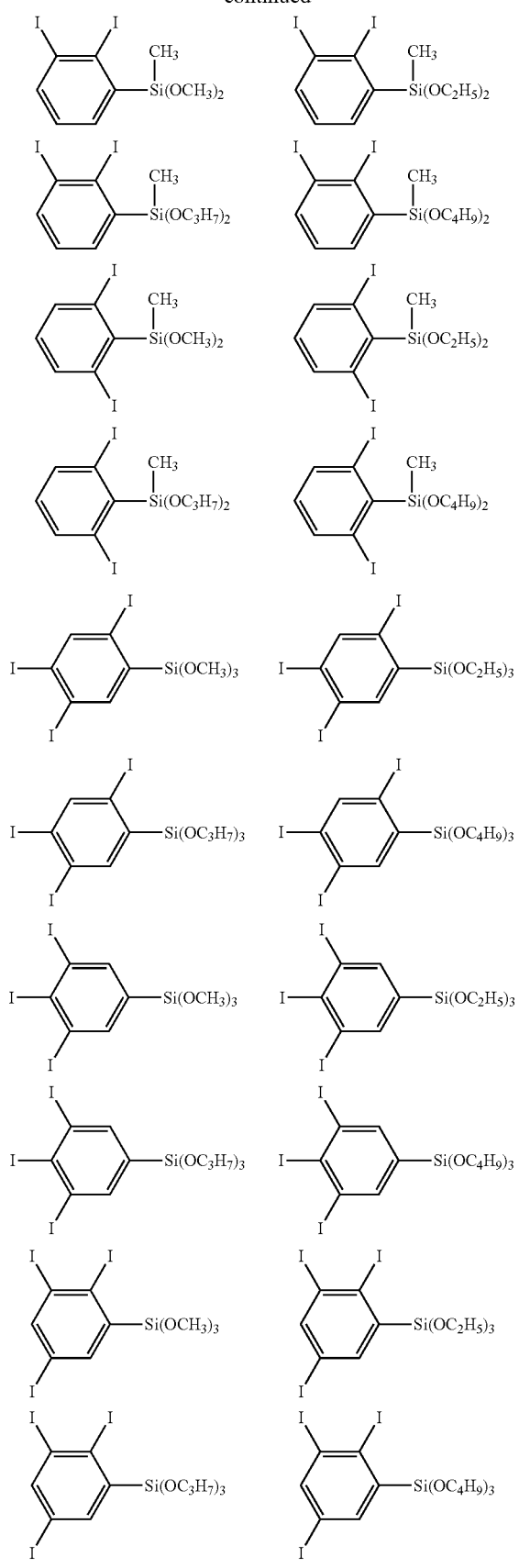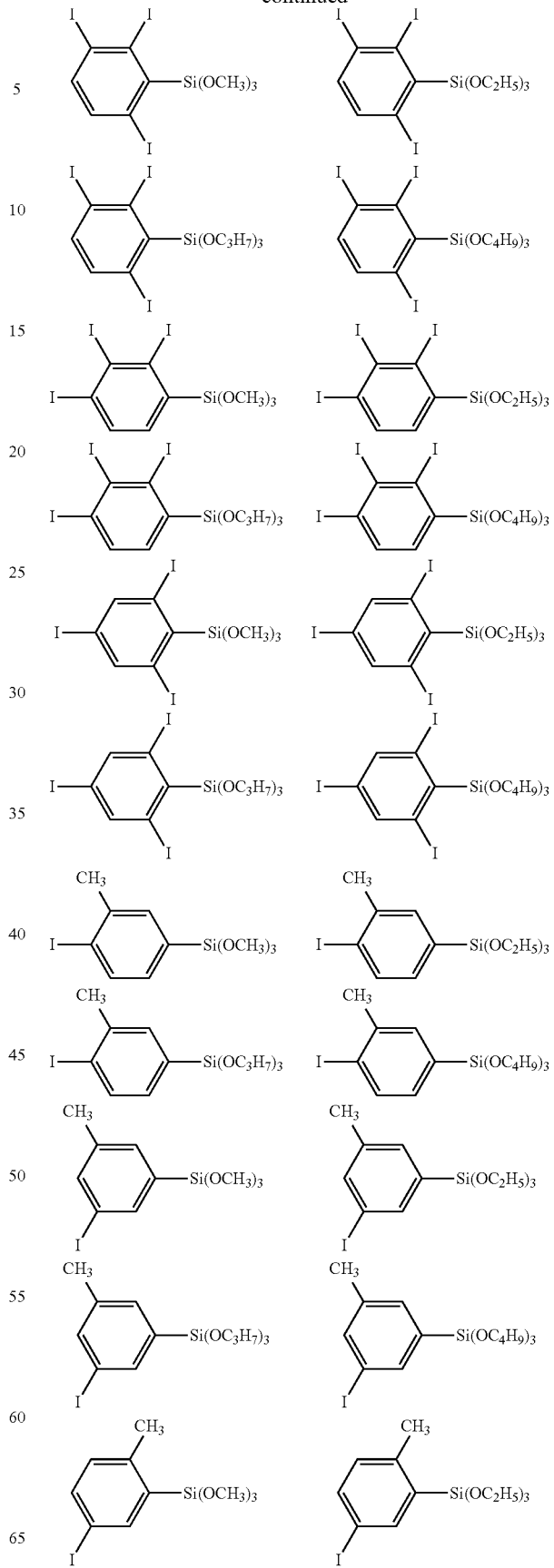

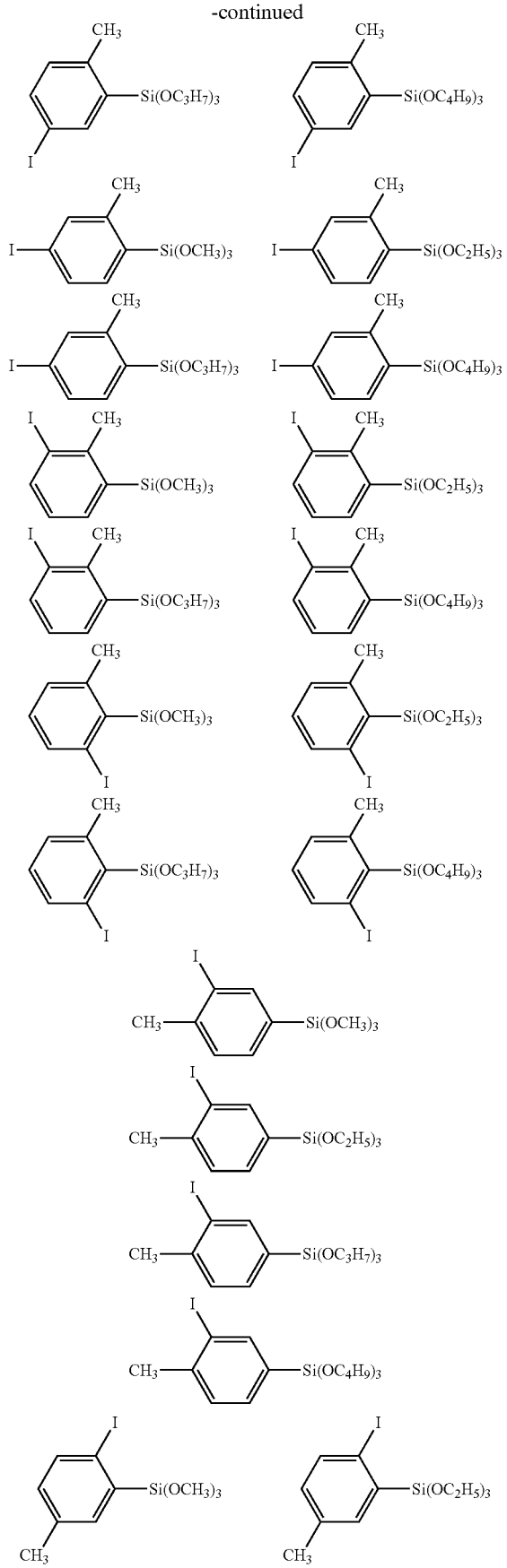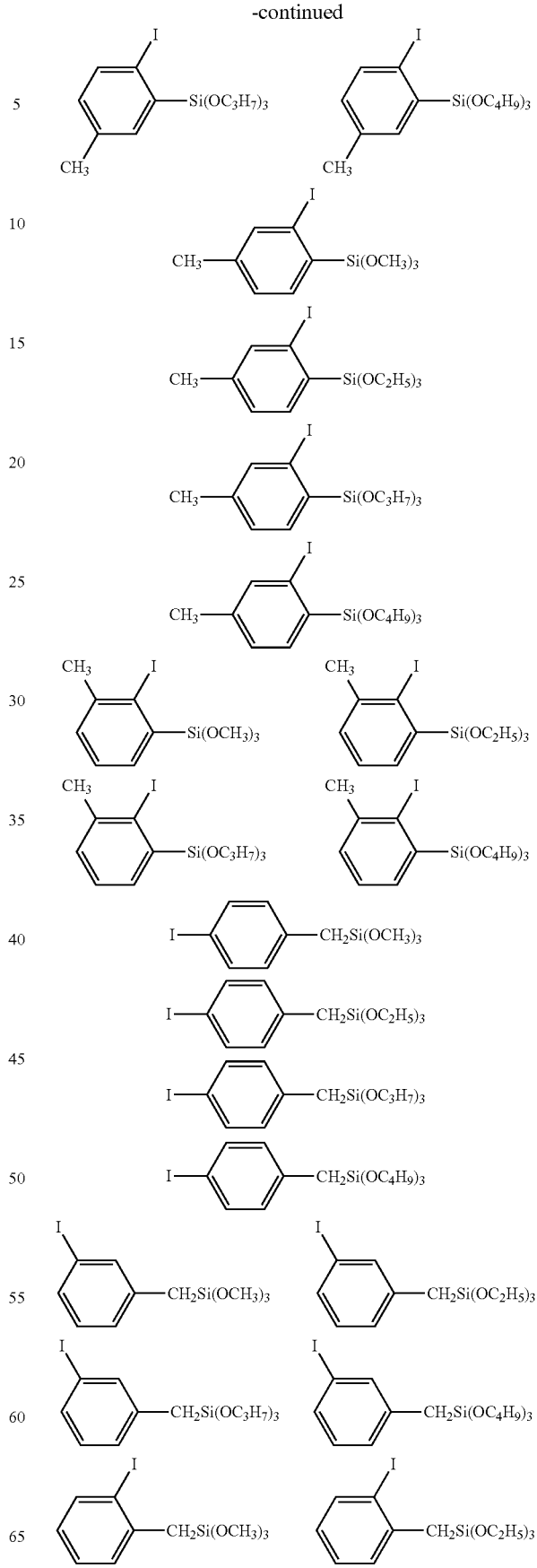

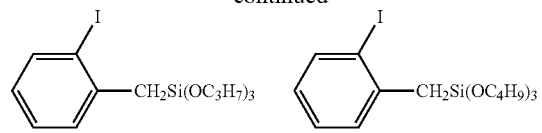
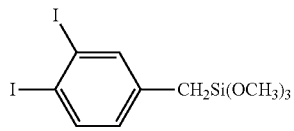
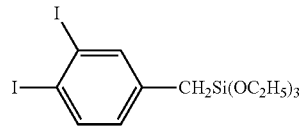
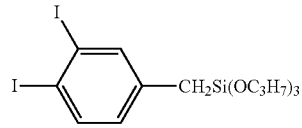
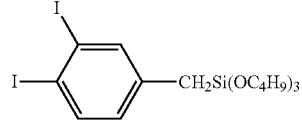
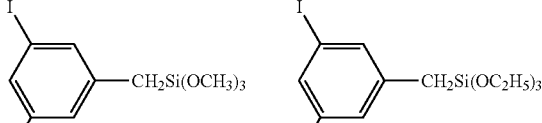
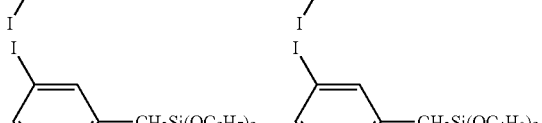
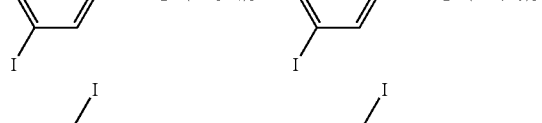
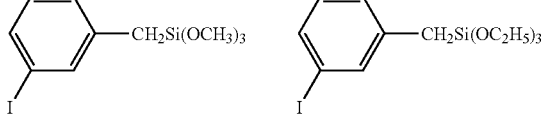
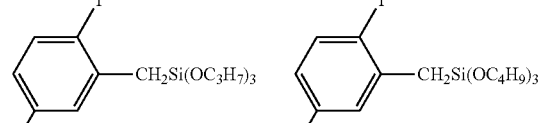
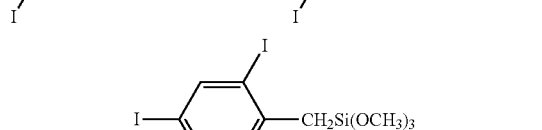
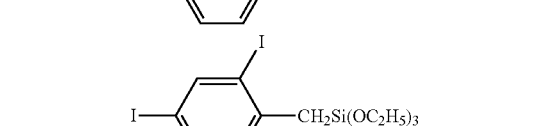
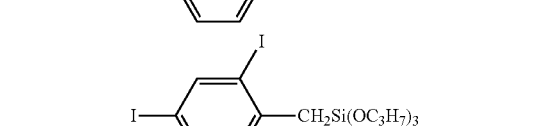
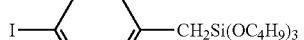
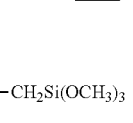
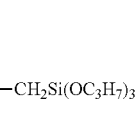
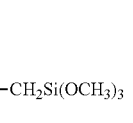
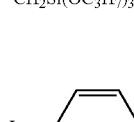
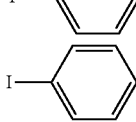
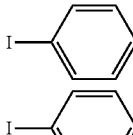
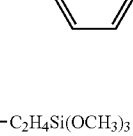
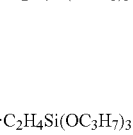
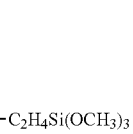
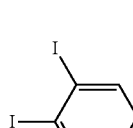
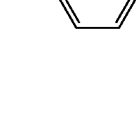

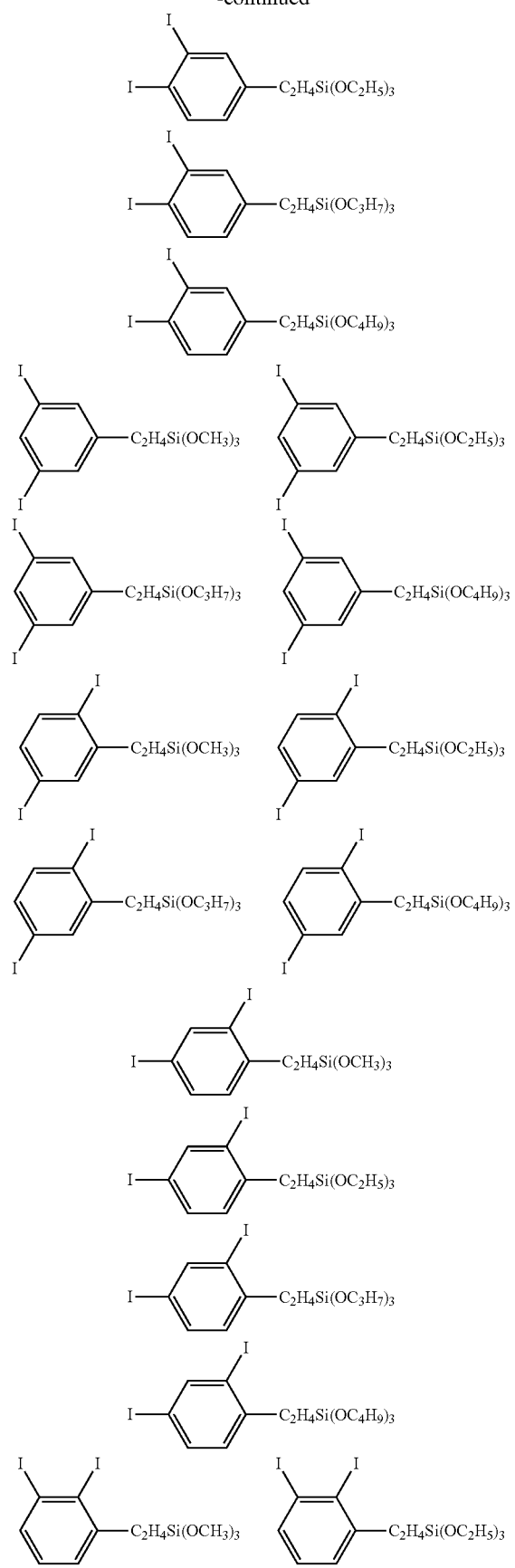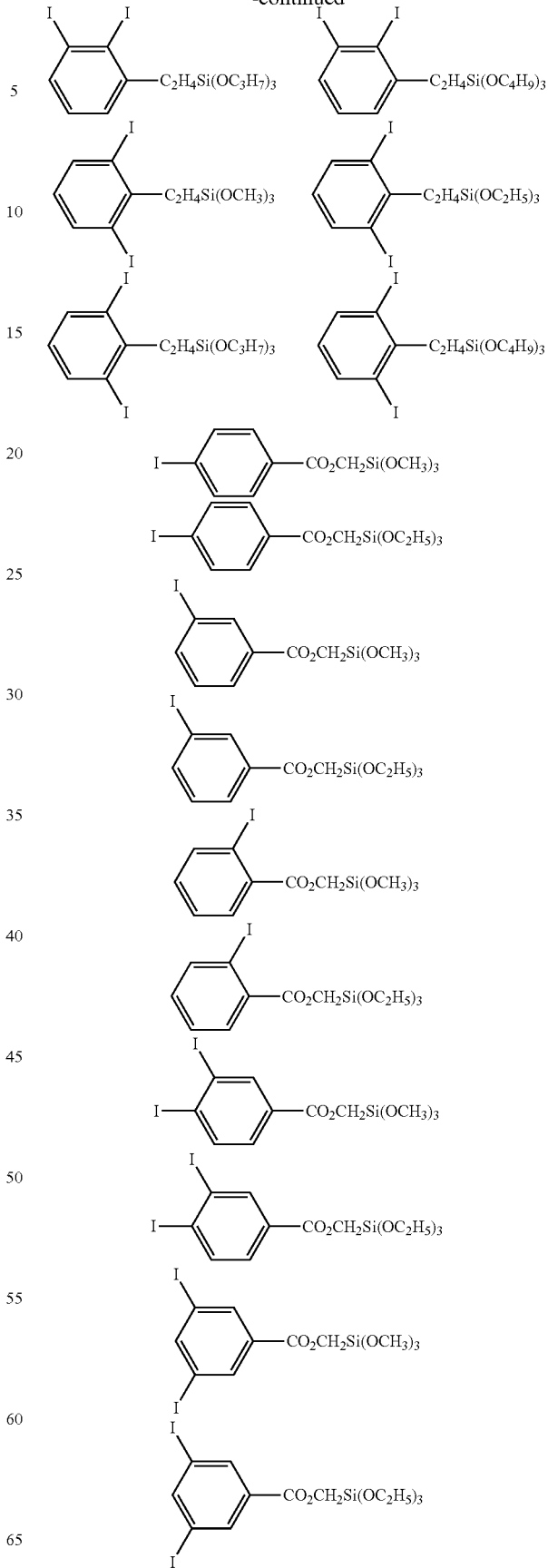

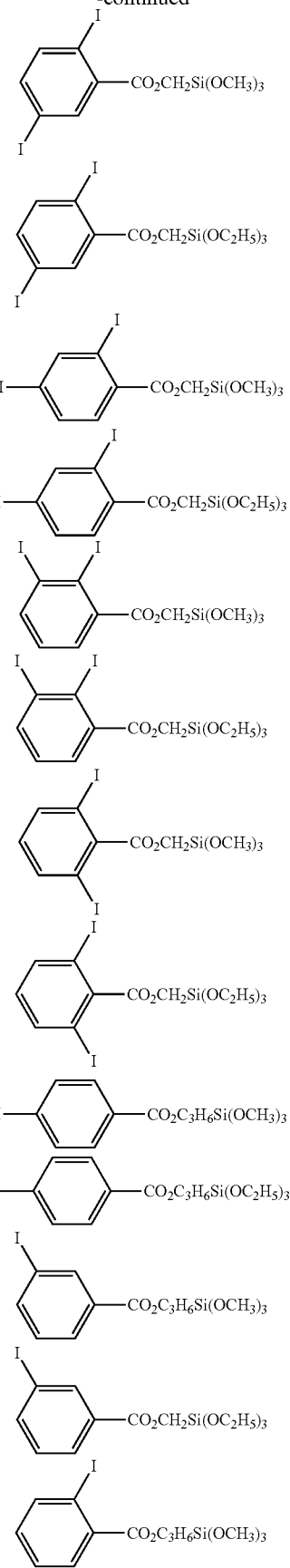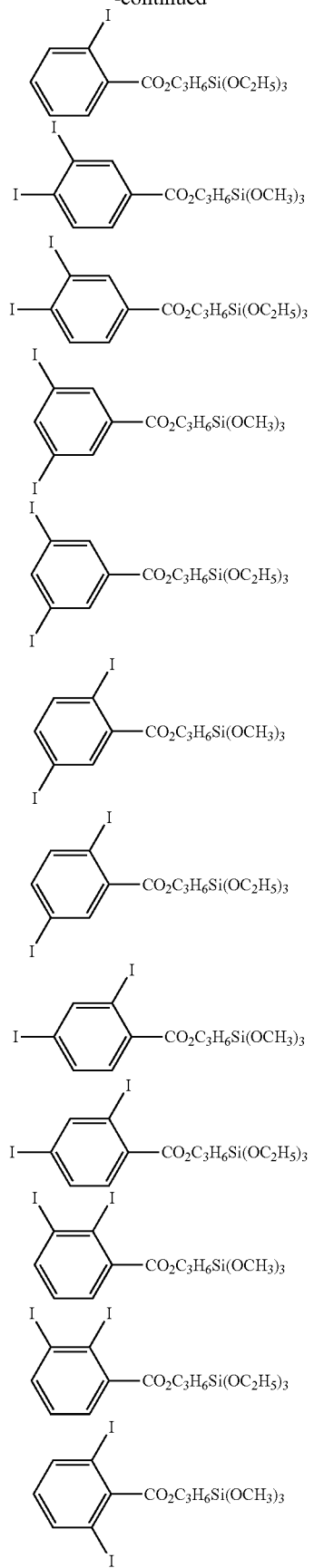

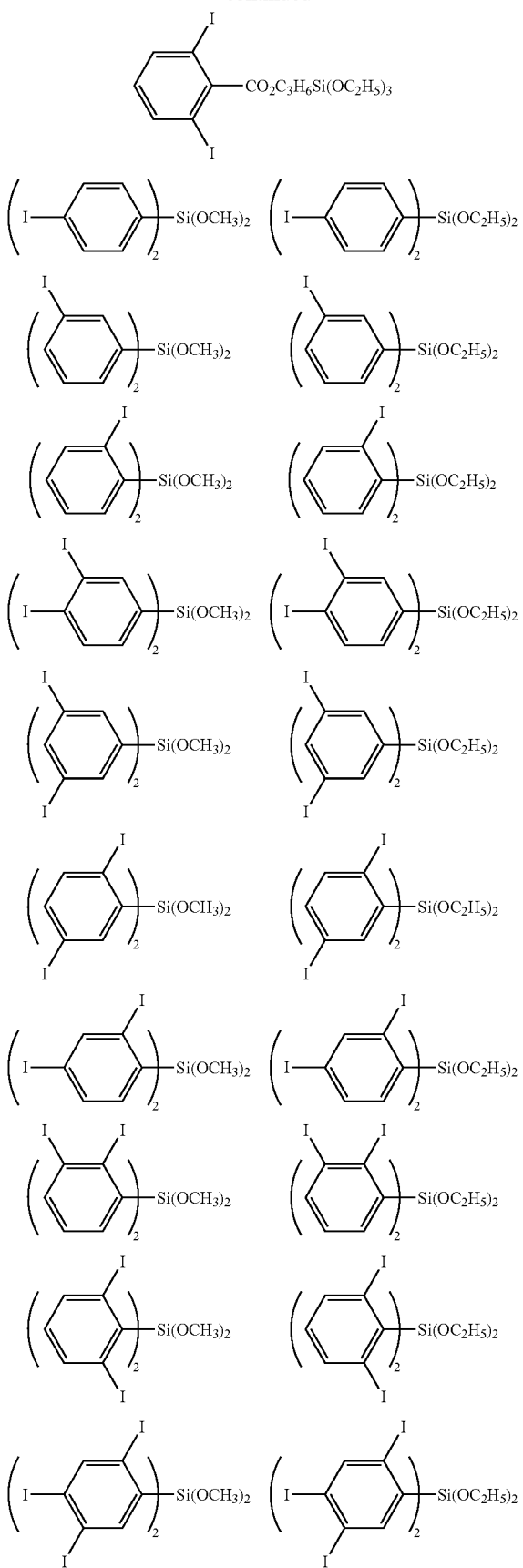
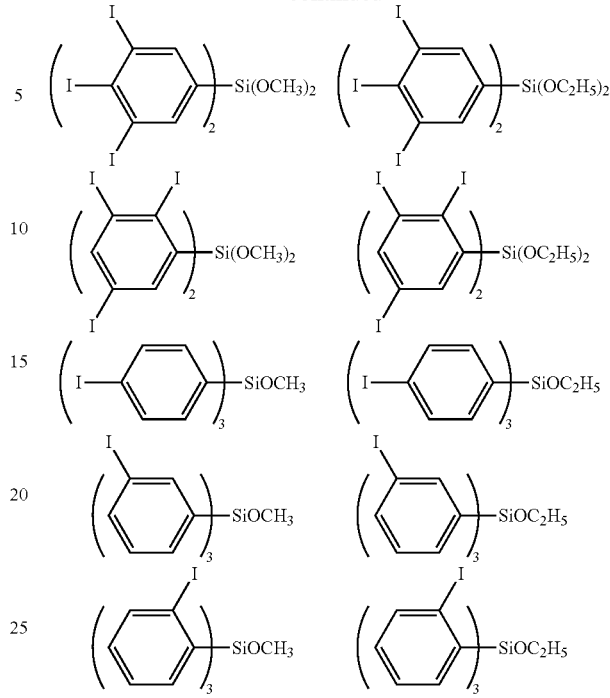

The resulting iodine-containing silicon compound can be directly used to produce an iodine-containing polysiloxane, or can be used to produce an iodine-containing polysiloxane after purified by distillation in some cases.

EXAMPLE

Hereinafter, the present invention will be specifically described by showing Examples and Comparative Examples. However, the present invention is not limited to the following Examples.

Example 1

A 300-ml three-necked glass flask was equipped with a reflux condenser and a thermometer. The inside of the flask was purged with nitrogen. This flask was charged with 27 g (0.1 mol) of 4-trimethylsilylphenyltrimethoxysilane and 80 g of methylene chloride. While the mixture was being stirred with a magnetic stirrer, the temperature inside the flask was adjusted to 10° C., and a mixture of 16.5 g of iodine monochloride and 80 g of methylene chloride was added dropwise over 30 minutes. Then, the resultant was aged at 25° C. for 1 hour. After it was confirmed that the raw material had disappeared by checking the reaction by GC, the reaction solution was concentrated using a rotary evaporator. Thus, crude 4-iodophenyltrimethoxysilane was obtained. This was distilled under reduced pressure, and 28.9 g (0.09 mol) of 4-iodophenyltrimethoxysilane was obtained. The yield was 89%.

Example 2

A 500-ml three-necked glass flask was equipped with a reflux condenser and a thermometer. The inside of the flask was purged with nitrogen. This flask was charged with 34 g (0.1 mol) of 3-trimethylsilylphenylethyltriethoxysilane and 100 g of methylene chloride. While the mixture was being stirred with a magnetic stirrer, the temperature inside the flask was adjusted to 10° C., and a mixture of 16.5 g of iodine monochloride and 80 g of methylene chloride was added dropwise over 30 minutes. Then, the resultant was aged at 25° C. for 1 hour. After it was confirmed that the raw material had disappeared by checking the reaction by GC, a mixture of 15 g of triethylamine and 20 g of ethanol was added dropwise at 25° C. over 5 minutes. The resultant was aged at 25° C. for 30 minutes. To the reaction solution, 100 g of hexane was added, and triethylamine hydrochloride salt was precipitated. This precipitate was separated by filtration, and the filtrate was concentrated using a rotary evaporator. Thus, crude 3-iodophenylethyltriethoxysilane was obtained. This was distilled under reduced pressure, and 36.1 g (0.09 mol) of 3-iodophenylethyltriethoxysilane was obtained. The yield was 92%.

Example 3

A 1000-ml three-necked glass flask was equipped with a reflux condenser and a thermometer. The inside of the flask was purged with nitrogen. This flask was charged with 34 g (0.1 mol) of 3, 4-bistrimethylsilylphenyltrimethoxysilane and 200 g of methylene chloride. While the mixture was being stirred with a magnetic stirrer, the temperature inside the flask was adjusted to 10° C., and a mixture of 33 g of iodine monochloride and 200 g of methylene chloride was added dropwise over 30 minutes. Then, the resultant was aged at 25° C. for 2 hours. After it was confirmed that the raw material had disappeared by checking the reaction by GC, a mixture of 30 g of triethylamine and 30 g of methanol was added dropwise at 25° C. over 10 minutes. The resultant was aged at 25° C. for 30 minutes. To the reaction solution, 300 g of hexane was added, and triethylamine hydrochloride salt was precipitated. This precipitate was separated by filtration, and the filtrate was concentrated using a rotary evaporator. Thus, crude 3, 4-diiodophenyltrimethoxysilane was obtained. This was distilled under reduced pressure, and 38.4 g (0.09 mol) of 3, 4-diiodophenyltrimethoxysilane was obtained. The yield was 84%.

Comparative Synthesis Example 1

A 300-ml three-necked glass flask was equipped with a reflux condenser and a thermometer. The inside of the flask was purged with nitrogen. This flask was charged with 20 g (0.1 mol) of phenyltrimethoxysilane and 80 g of methylene chloride. While the mixture was being stirred with a magnetic stirrer, the temperature inside the flask was adjusted to 10° C., and a mixture of 16.5 g of iodine monochloride and 80 g of methylene chloride was added dropwise over 30 minutes. Then, the resultant was aged at 25° C. for 1 hour. When the reaction was checked by GC, the raw material remained unreacted. Subsequently, the reaction temperature was adjusted to 40° C., and the reaction was allowed for another 3 hours. Consequently, the raw material broke down, and a peak of iodobenzene was exhibited.

Comparative Synthesis Example 2

A 300-ml three-necked glass flask was equipped with a reflux condenser and a thermometer. The inside of the flask was purged with nitrogen. This flask was charged with 23 g (0.1 mol) of phenylethyltrimethoxysilane and 80 g of methylene chloride. While the mixture was being stirred with a magnetic stirrer, the temperature inside the flask was adjusted to 10° C., and a mixture of 16.5 g of iodine monochloride and 80 g of methylene chloride was added dropwise over 30 minutes. Then, the resultant was aged at 25° C. for 1 hour. When the reaction was checked by GC, the raw material remained unreacted. Subsequently, the reaction temperature was adjusted to 40° C., and the reaction was allowed for another 30 hours, but no progress in the reaction was observed.

In Examples, each raw material did not break down by the reaction at 25° C. (around room temperature) for 1 to 2 hours, but the raw material successfully disappeared. Thus, it was possible to obtain the target iodophenyl group-containing silicon compounds in high yields.

On the other hand, since the raw materials used in Comparative Examples were different from the trialkylsilylphenyl group-containing silicon compound used in the present invention, even when iodine monochloride was used as the iodine-containing electrophilic reagent, the raw materials did not disappear at around room temperature. When the reaction temperature and also the reaction time were increased, the raw materials broken down. Consequently, the target iodophenyl group-containing silicon compounds were not obtained.

The above results demonstrated that an iodine-containing silicon compound can be produced by substituting iodine for a trialkylsilyl group under moderate conditions in a short time, in other words, an iodophenyl group-containing silicon compound can be economically produced without causing hydrolysis of a hydrolysable alkoxy group.

The present invention is capable of economically producing an iodophenyl group-containing hydrolysable silicon compound, which is for forming an iodophenyl group-containing polysiloxane underlayer film expected to improve EUV lithography performance. This indicates that the industrial value of the present invention is quite high.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for producing a silicon compound containing an iodophenyl group, comprising substituting iodine for a trialkylsilyl $((R^0)_3Si)$ group bonded to a phenyl group by using an iodine-containing electrophilic reagent (I-X) as shown by the following reaction equation:

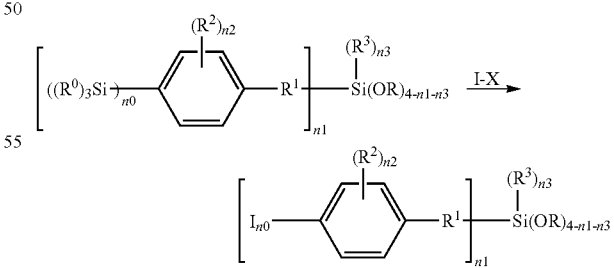

wherein all of $R^0$'s may be identical to or different from each other and each represent an alkyl group having 1 to 6 carbon atoms; $R^1$ represents a single bond or a divalent organic group; $R^2$ represents an organic group having 1 to 10 carbon atoms; $R^3$ represents an organic group having 1 to 10 carbon atoms; R represents an organic group having 1 to 6 carbon atoms; n0 is 1, 2, or 3, n1 is 1, 2, or 3, n2 is 0, 1, or 2, and n3 is 0, 1, or 2, provided that $1 \leq n1+n3 \leq 3$; and X represents a counter substituent of iodine, acting as an electrophilic reactive species.

2. The method for producing a silicon compound containing an iodophenyl group according to claim 1, wherein the $R^0$ is a methyl group or an ethyl group.

3. The method for producing a silicon compound containing an iodophenyl group according to claim 1, wherein the iodine-containing electrophilic reagent is iodine monochloride.

4. The method for producing a silicon compound containing an iodophenyl group according to claim 2, wherein the iodine-containing electrophilic reagent is iodine monochloride.

* * * * *